(12) United States Patent
Fulford et al.

(10) Patent No.: US 12,191,210 B2
(45) Date of Patent: Jan. 7, 2025

(54) FORMATION OF HIGH DENSITY 3D CIRCUITS WITH ENHANCED 3D CONDUCTIVITY

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 373 days.

(21) Appl. No.: 17/721,124

(22) Filed: Apr. 14, 2022

(65) Prior Publication Data

US 2022/0367290 A1 Nov. 17, 2022

Related U.S. Application Data

(60) Provisional application No. 63/188,039, filed on May 13, 2021.

(51) Int. Cl.
| | |
|---|---|
| *H01L 21/8238* | (2006.01) |
| *H01L 21/8234* | (2006.01) |
| *H01L 27/092* | (2006.01) |
| *H01L 29/45* | (2006.01) |
| *H01L 29/66* | (2006.01) |

(Continued)

(52) U.S. Cl.
CPC ............ *H01L 21/823814* (2013.01); *H01L 21/823418* (2013.01); *H01L 21/823487* (2013.01); *H01L 21/823885* (2013.01); *H01L 27/092* (2013.01); *H01L 29/456* (2013.01); *H01L 29/66666* (2013.01); *H01L 29/7827* (2013.01); *H01L 29/78642* (2013.01)

(58) Field of Classification Search
CPC ......... H01L 29/66666; H01L 29/7827; H01L 29/78642; H01L 29/41741; H01L 29/456; H01L 27/092; H01L 27/088; H01L 21/823412; H01L 21/823807; H01L 21/823885; H01L 21/823487; H01L 21/823814; H01L 21/823418
See application file for complete search history.

(56) References Cited

U.S. PATENT DOCUMENTS

| | | | |
|---|---|---|---|
| 5,308,778 A * | 5/1994 | Fitch .................. | H01L 27/0688 |
| | | | 257/E29.267 |
| 5,612,563 A * | 3/1997 | Fitch ................. | H01L 21/76897 |
| | | | 257/E29.267 |

(Continued)

*Primary Examiner* — Michael M Trinh
(74) *Attorney, Agent, or Firm* — Foley & Lardner LLP

(57) ABSTRACT

Structures and methods are disclosed in which a layer stack can be formed with a plurality of layers of a metal, where each of the layers of metal can be separated by a layer of a dielectric. An opening in the layer stack can be formed such that a semiconductor layer beneath the plurality of layers of the metal is uncovered. One or more vertical channel structures can be formed within the opening by epitaxial growth. The vertical channel structure can include a vertically oriented transistor. The vertical channel structure can include an interface of a silicide metal with a first metal layer of the plurality of metal layers. The interface can correspond to one of a source or a drain connection of a transistor. The silicide metal can be annealed above a temperature threshold to form a silicide interface between the vertical channel structure and the first metal layer.

10 Claims, 27 Drawing Sheets

(51) Int. Cl.
*H01L 29/78* (2006.01)
*H01L 29/786* (2006.01)

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 9,899,411 B2* | 2/2018 | Yoo | H01L 29/1037 |
| 2022/0102552 A1* | 3/2022 | Fulford | H01L 21/823878 |
| 2022/0139786 A1* | 5/2022 | Gardner | H01L 21/823871 |
| | | | 438/212 |
| 2022/0140112 A1* | 5/2022 | Fulford | H01L 21/823481 |
| | | | 257/329 |
| 2022/0359294 A1* | 11/2022 | Gardner | H01L 27/0688 |
| 2022/0359312 A1* | 11/2022 | Fulford | H01L 29/7827 |

\* cited by examiner

| | | |
|---|---|---|
| 105 | ■ | Metal 1 |
| 110 | ▨ | Dielectric 1 |
| 115 | ▨ | Dielectric 2 |
| 120 | ☐ | Silicon |
| 125 | ▨ | PR |
| 130 | ▨ | SiGe |
| 135 | ▨ | Metal2 |
| 140 | ▨ | p-Si |
| 145 | ▨ | High-k |
| 150 | ▨ | Metal2 silicide |
| 155 | ▨ | Metal 3 |
| 160 | ■ | n-Si |
| 165 | ▨ | Metal3 silicide |
| 170 | ■ | Die3 |
| 175 | ☐ | Die4 |
| 180 | ▨ | Metal4 |

Cross-sectional view 2100

Top view 2102

255

| | |
|---|---|
| 105 | Metal 1 |
| 110 | Dielectric 1 |
| 115 | Dielectric 2 |
| 120 | Silicon |
| 125 | PR |
| 130 | SiGe |
| 135 | Metal2 |
| 140 | p-Si |
| 145 | High-k |
| 150 | Metal2 silicide |
| 155 | Metal 3 |
| 160 | n-Si |
| 165 | Metal3 silicide |
| 170 | Die3 |
| 175 | Die4 |
| 180 | Metal4 |

Cross-sectional view 2600

Top view 2602

FORMATION OF HIGH DENSITY 3D CIRCUITS WITH ENHANCED 3D CONDUCTIVITY

CROSS-REFERENCE TO RELATED APPLICATIONS

This application claims priority to U.S. Provisional Application Ser. No. 62/188,039, filed May 13, 2021, which is incorporated by reference in its entirety.

TECHNICAL FIELD

This disclosure related to microelectronic devices including semiconductor device, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are increasingly having greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Faced with the challenge of fabricating microelectronic devices with feature sizes that are only several atoms thick, fabricators of integrated circuits ("IC") encounter technical issues, such as leakage currents and short-channel effects. These technical issues for IC fabrication can be overcome with 3D semiconductor circuits in which transistors are vertically stacked on top of one another. Such 3D integration can help overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. For example, 3D integration for logic chips, such as central processing unit (CPU), a graphics processing unit (GPU), a field programmable gate array (FPGA), or a system on a chip (SoC) can be more challenging than implementing simpler and smaller circuits in a similar way. A part of this challenge can involve difficulty in forming electrical contacts for semiconductor devices in a way that provides for a flexible routing of electrical conductor lines and maintains a strong electrical continuity with the active regions of semiconductor devices.

Salicidation can include techniques in which self-aligned silicide can be formed when a thin film of metal, suitable for forming silicide when interfacing with a semiconductor, is annealed above a temperature level suitable for forming the given silicide. For instance, salicidation can be implemented by applying heat (e.g., heat that causes annealing of a thin film of metal) to at least a region of a semiconductor device (e.g., a source or a drain contact) that includes a thin film of metal capable of forming a silicide layer (e.g., silicide metal) adjoining or abutting a semiconductor material (e.g., silicon). Once annealed, the silicide layer that is formed from the thin film of metal interfacing with the semiconductor material can be referred to as a metal silicide.

The present solution can include structures and methods for fabricating 3D microelectronic devices having one or more metal layers in a material stack that can provide a 3D metal contact routing in 360 degrees for the source, drain, and gate contacts of a transistor. The present solution can further utilize one or more different 3D salication techniques for the source or drain regions of a transistor in a 3D stack. 3D salicidation can be implemented and controlled using 360 degree ALD deposition in accordance with various methods described herein. For example, in one implementation, an entire of stack 3D devices is enabled to be salicided at one process step with two or more metal types. The present solution can provide enhanced 3D conductivity and performance using salicided source and drain contacts of the 3D vertically stacked transistors whose metal contacts can be routed 360 degrees around the device.

In some aspects the present disclosure relates to a method of microfabrication. The method can include forming a layer stack. The layer stack can include a plurality of layers of a metal. Each of the plurality of layers of the metal can be separated by a layer of a dielectric. The method can include forming an opening in the layer stack such that a semiconductor layer beneath the plurality of layers of the metal is uncovered. The method can include forming a vertical channel structure within the opening by epitaxial growth. The vertical channel structure can include a vertically oriented transistor. The vertical channel structure can include an interface of a silicide metal with a first metal layer of the plurality of metal layers. The interface can correspond to one of a source or a drain connection of a transistor. The method can anneal the silicide metal above a temperature threshold to form a silicide interface between the vertical channel structure and the first metal layer.

The method can include forming the layer stack so that the layer stack includes three layers of the metal and two layers of the dielectric, where each of the two layers of the dielectric is distinct from one another and separates successive layers of the three layers of the metal. The method can include forming a layer of material between the vertical channel structure and the semiconductor layer to electrically insulate the vertical channel structure from the semiconductor layer. The method can include forming the vertical channel structure to include forming a layer of electrically conductive material on top of the vertical channel structure. The layer of electrically conductive material can be in electrical contact with one of the source or the drain of the vertical channel structure. The method can include removing a core region of the vertical channel structure to form a core channel and disposing a core dielectric in the core channel. The vertical channel structure can include a transistor.

In some aspects the present disclosure relates to a method of microfabrication of two or vertical channel structures, such as transistors, in a 3D vertical structure. The method can include forming a first layer stack. A first layer of the first layer stack can include at least two sub-stacks, including a first sub-stack that can include three metal layers of a first metal that alternate with layers of a first dielectric and a second sub-stack that can include three metal layers of a second metal that alternate with layers of the first dielectric. The method can include forming an opening in the first layer stack through the first and second sub-stacks such that a semiconductor layer beneath the first and second sub-stacks is uncovered. The method can include forming vertical channel structures within the opening by epitaxial growth such that a first vertical channel structure of the first sub-stack is separated from a second vertical channel structure of the second sub-stack. The method can include forming, within the first vertical channel structure, an interface of a first silicide metal at a first metal layer for one of a source or a drain connection. The method can include forming, within the second vertical channel structure, an interface of a second silicide metal at second metal layer for a remaining one of the source or the drain connection. The method can include annealing the first silicide metal and the second silicide metal to form a first silicide interface between the first vertical channel structure and the first metal layer for one of the source or the drain connection, and to form a second silicide interface between the second vertical channel structure and the second metal layer for the remaining one of the source or drain connection.

The method can include forming the interfaces of the first and second silicide metals that includes forming the interfaces using different silicide metals. The method can include forming the vertical channel structures within the opening that includes forming a layer of material to electrically insulate the first vertical channel structure from the second vertical channel structure. The method can include annealing wherein the first silicide metal and the second silicide metal are annealed at a same time. The method can include forming the first layer stack that includes forming the first metal of the first sub-stack and the second metal of the second sub-stack using a same metal.

In some aspects, the present disclosure relates to a semiconductor structure. The semiconductor structure can include a layer stack. The layer stack can including a plurality of layers of a metal. Each of the plurality of layers of the metal can be separated by a layer of a dielectric. The semiconductor structure can include an opening formed in the layer stack such that a semiconductor layer beneath the plurality of layers of the metal is uncovered. The semiconductor structure can include a vertical channel structure formed within the opening by epitaxial growth. The vertical channel structure can include an interface of a silicide metal with a first metal layer of the plurality of metal layers. The interface can correspond to one of a source or a drain connection of a transistor. The semiconductor structure can include a silicide interface or a silicide region or structure between the vertical channel structure and the first metal layer formed by annealing the structure above a temperature threshold.

The semiconductor structure can include the layer stack including three layers of the metal and two layers of the dielectric, wherein each of the two layers of the dielectric is distinct from the other and separates the three layers of the metal. The semiconductor structure can include a layer of material between the vertical channel structure and the semiconductor layer electrically insulating the vertical channel structure from the semiconductor layer.

The semiconductor structure can include the vertical channel structure including a layer of electrically conductive material on top of the vertical channel structure. The layer of electrically conductive material can be in electrical contact with one of the source or the drain of the vertical channel structure. The semiconductor structure can include a core region of the vertical channel structure that is removed to form a core channel. A core dielectric can be disposed in the core channel.

The semiconductor structure can include a second vertical channel structure that can be formed by epitaxial growth within the opening and within a sub-stack of the layer stack. The sub-stack can include three metal layers of a second metal that alternate with layers of a second dielectric. The semiconductor structure can include a second silicide interface between the second vertical channel structure and a first layer of the second metal that is formed by annealing above a temperature threshold. The semiconductor structure can include the second silicide interface corresponding to one of the source or the drain connection of second vertical channel structure. The semiconductor structure can include a material within the opening electrically insulating the vertical channel structure from the second vertical channel structure. The semiconductor structure can include a core region that can extend through a center of a vertical channel structure and a center of the second vertical channel structure. The core region can be filled with a dielectric that provides electrical insulation to at least one of the vertical channel structure or the second vertical channel structure.

These and other aspects and implementations are described in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the present disclosure can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
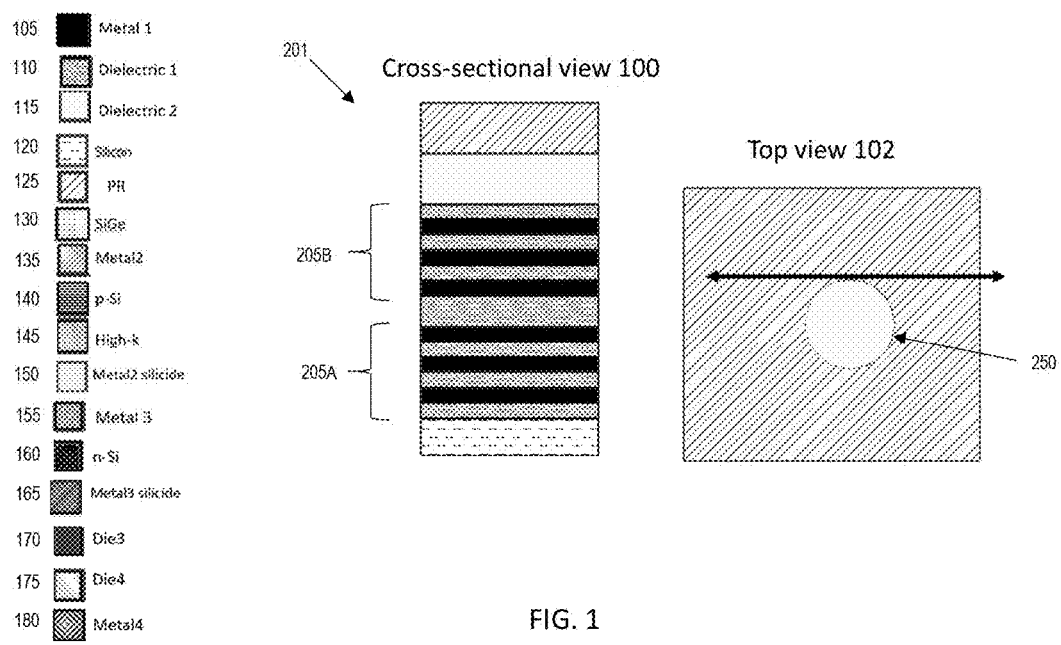
FIGS. 1-15 include cross-sectional and top-down of an embodiment of an example fabrication flow for manufacturing a structure in which one or more vertical channel structures use one type of one or more metals for electrical line layout and a different type of one or more silicide metals for 3D salicidation regions.

Reference will now be made to various illustrative embodiments depicted in the drawings, and specific language will be used to describe the same. It will nevertheless be understood that no limitation of the scope of the claims or this disclosure is thereby intended. Alterations and further modifications of the inventive features illustrated herein, and additional applications of the principles of the subject matter illustrated herein, which would be apparent to one of ordinary skill in the relevant art having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

It is understood that apparatuses, systems and devices produced by the structures described herein can be used or find their application in any number of electronic devices utilizing structures and/or circuits described herein, such as for example, controllers, memory chips, systems or process on a chip processors, graphics processing units, central processing units and more. For example, structures and/or circuits described herein can include a part of systems utilizing memory, such as any computing systems including for example: computers, phones, servers, cloud computing devices, and any other device or system that utilizes integrated circuit devices.

Techniques herein include methods and structures for 3D microelectronic devices including vertical transistors. Techniques herein enable multiple metal types for 3D routing for 360 degree access to transistor elements. Techniques herein may enable different 3D salicidation for different source drain regions in the same 3D stack. 3D salicidation may be precisely controlled because of 360 degree ALD deposition is enabled. Various alternative methods are also disclosed. In one embodiment, an entire stack of 3D devices is enabled to be salicided at one process step with two or more metal types. Enhanced 3D conductivity may be accordingly achieved as well as a performance boost of 3D devices.

Several embodiments will be described with reference to the drawings. One embodiment includes a method of internal vertical core 3D epitaxial regions for enhanced conductivity and routing. This flow uses one type of metal for layout but different silicide metals for internal 3D salicidation regions. Another embodiment uses one type of metal for layout and one silicide metal for internal 3D salicidation regions. Another embodiment uses two types of metal for layout and two silicide metals for internal 3D salicidation regions. Another embodiment uses two external routing metals for layout and two silicide metal formation for external 3D salicidation regions. Of course, the various embodiments and elements can be combined in additional combinations.

The embodiments described herein may enable an increased stack height of one or more 3D semiconductor devices. Therefore, a semiconductor substrate can be used, but is not required, and any base layer material (e.g., glass, organic, etc.) may be used instead of a silicon substrate. A base layer, therefore, can be a semiconductor substrate, such as a silicon substrate or any other semiconductor, ceramic, metal or other material substrate.

The process flows described herein can utilize conductive dielectric materials to form NMOS and PMOS devices. As such, the techniques described herein can be used to produce devices that are manufactured, or "stacked" on any existing vertically stacked device or substrate, according to various implementations. The present techniques may improve upon other semiconductor manufacturing techniques by increasing the N height of stacked semiconductor devices, such as transistors, thereby providing high density logic. Although illustrations herein may show an NMOS device arranged over a PMOS device, alternative configurations may include a PMOS device over NMOS device, NMOS device over NMOS device, PMOS device over PMOS device, or other alternative including one or more NMOS devices or PMOS devices for any number of N stacks and in any order or arrangement.

Dielectric materials used herein can be any material or materials having low electrical conductivity, such as for example one millionth of a mho/cm. Dielectric materials can include, for example, silicon dioxide, silicon nitride, nanoporous silica, hydrogensilsesquioxanes (HSQ), Teflon-AF (Polytetrafuoethene or PTFE), Silicon Oxyflouride. Dielectric materials can also include, for example, ceramics, glass, mica, organic and oxides of various metals.

High-k dielectric, also referred to as high-k material, can refer to any material with a higher dielectric constant as compared to the silicon dioxide. For example, high-k dielectric can include hafnium silicate, zirconium silicate, hafnium dioxide, zirconium dioxide, and others.

Various metals, such as gate metal and the source/drain metal, can be used herein and can include any metal or any electrically conductive material. For example, metals used in the present solution can include aluminum, copper, titanium, ruthenium, titanium, tungsten, silver, gold or any other metal. For the purposes of the present solution, in addition to the metals, source/drain metals or gate metals can also include other electrically conductive materials, such as highly doped semiconductors, for example.

Metals suitable for forming silicide, also referred to as silicide metals, can be used to form silicides with semiconductor materials with which the metals interface. For example, salicidation can occur when a thin silicide metal layer formed in active regions of a vertical channel structure, such as between a metal contact for a source or a drain of a transistor and an interfacing semiconductor material, is annealed above a threshold temperature (e.g., annealing temperature) suitable for forming a silicide with those particular materials (i.e., metal interfacing with semiconductor materials). In such instances, if the silicide metal thin film reacts to form a silicide between the metal source/drain contact and the semiconductor material, the resulting structure can include a cross-section of: source or drain contact metal/silicide (e.g., metal silicide)/semiconductor. If however, a portion of the thin film of silicide metal does not react, the resulting structure can include a cross-section of: metal/(unreacted) silicide metal/silicide (e.g., metal silicide)/semiconductor. In some implementations, either full or partial salicidation can be implemented for any semiconductor device. Silicide metals can include, for example, any metal that can form a silicide with a semiconductor material upon annealing, such as titanium, cobalt, nickel, platinum, and tungsten.

The order of description or fabrication steps performed or described herein has been presented for clarity sake and as an example. The fabrication steps described herein can be performed in any suitable order. Additionally, although each of the different features, techniques, configurations described herein may be described in different places of this disclosure, it is intended that each of the concepts can be executed independently of each other or in combination with each other. Accordingly, the solutions described herein can be embodied and viewed in many different ways.

Reference will now be made to the Figures, which for the convenience of visualizing the 3D semiconductor fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections, and they should not be considered limiting to the scope of the claims. Conversely, when example illustrations do not show electrical connections to components that are electrically contacted, it is understood that such electrical connections can be made as understood by a person of ordinary skill.

Although the Figures and aspects of the disclosure may show or describe devices herein as having a particular shape, it should be understood that such shapes, whether of the structures or features, are used as examples of the present solution and are merely illustrative and should not be considered limiting to the scope of the techniques described herein. For example, although most of the Figures show various layers in a rectangular shaped configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Likewise, the techniques described herein may provide for one to any number N nanosheets and 2D material channels stacked in a transistor or another device. Further, although the devices fabricated using these techniques are shown as transistors, it should be understood that any type of electronic device may be manufactured using such techniques, including but not limited to transistors, variable resistors, resistors, capacitors, memory components, logic gates and components and any other components known or used in the art.

Despite the fact that illustrated embodiments for simplicity and brevity show examples of only a single or double transistor structures being formed using the techniques of the present solution, any number of transistors can be formed above and beside the transistor structures illustrated in examples illustrated, such as may be desired for forming a 3D array of devices.

Techniques described herein can include methods and structures for 3D microelectronic devices that can include vertical transistors. Techniques herein can provide multiple metal types for 3D routing for a 360 degree access to various transistor elements and parts, as well as different 3D salicidation for source and drain regions or structures of a transistor in the same 3D stack. 3D salicidation can be controlled using 360 degree ALD deposition, for which various alternative methods are disclosed. In one example, a stack of 3D devices can be salicidated in one process step where two or more metal types for source and drain contacts of the 3D stacked devices can be used. By providing salicidated contacts or structures, enhanced 3D conductivity and performance boost for 3D devices can be achieved.

Among several example embodiments of the present solution described herein, one example can include a method of a flow of fabrication steps for manufacturing internal vertical core 3D epitaxial region for enhanced conductivity and routing. In example flow, one type of metal can be used for layout but different silicide metals can be used for internal 3D salicidation regions. Another example flow can use one type of metal for layout and one silicide metal for internal 3D salicidation regions. Another example flow can use two types of metal for layout and two silicide metals for internal 3D salicidation regions. Another example flow can use two external routing metals for layout and two silicide metal formations for external 3D salicidation regions. Various embodiments and elements can be combined in additional combinations across these and other flow examples.

Figure 16:
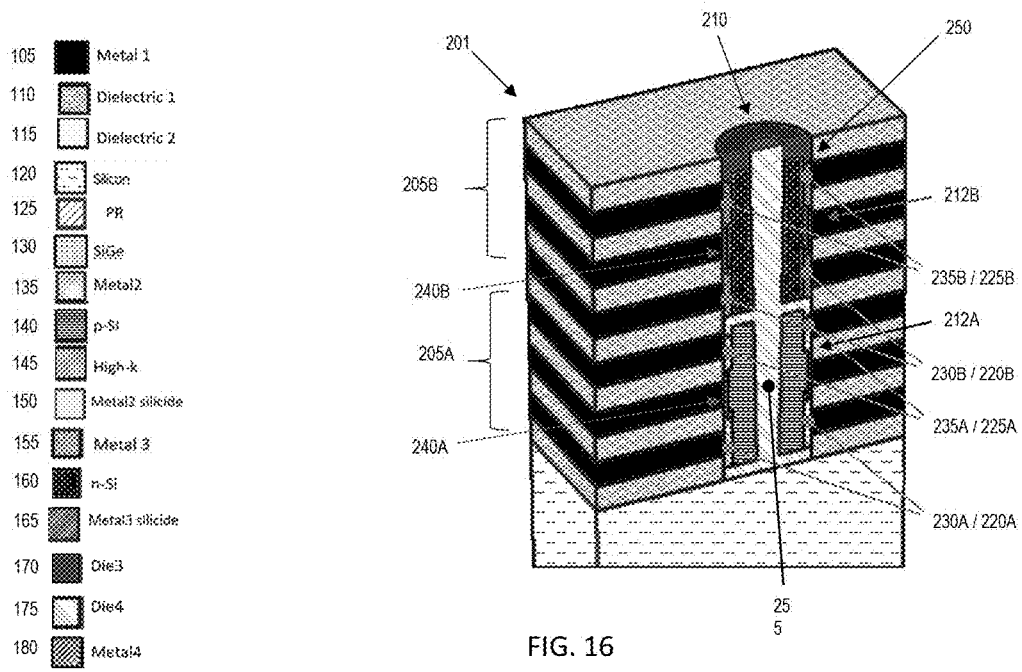
FIGS. 16-17 include cross-sectional and perspective views of an example structure implemented using one or more fabrication flows described herein.

Prior to describing the fabrication steps for manufacturing the present solution, it may be useful to first briefly overview a vertical layer structure or structure 210 (see FIG. 16, for example) that includes salicidation regions and its components. An example of the present solution structure is illustrated in FIG. 16 illustrating a three-dimensional, perspective view of a cross-section of a layer stack 201 in which a structure 210 is formed. The layer stack 201 can be formed on a substrate, such as a silicon substrate 120. The example layer stack 201 can include a first layer of dielectric (e.g., dielectric 110) that can be formed on top of the 120 silicon substrate. Multiple layers of metal, such as metal 105, can be formed on the first dielectric 110. Each layer of metal 105, can be separated from another metal layer, which can include the same or a different metal (e.g., metal 105, 180 or similar) by an intervening layer of dielectric, (e.g., dielectric 1 110) or any other combination of dielectrics including for example dielectrics 115, 170 or 175. Metal layers (e.g. metal 105) and dielectric layers (e.g. dielectric 110) can alternate with each other and include, for example six pairs of metal and dielectric layers, thereby forming a layer stack of six metal layers 105 paired with and separated by six dielectric layers 110, formed on top of the first layer of dielectric 110 that can sit on the silicon substrate 120. The layer stack 201 can therefore include seven dielectric layers 110 surrounding six metal layers 105.

Shown in FIG. 16, a layer stack 201 can include multiple sub-stacks 205A and 205B. For example, sub-stack 205A can be formed in the lower part of the layer stack 201 and can include at least a first three pairs of metal and dielectric layers. Sub-stack 205B can be formed on the upper part of the layer stack 201, above sub-stack 205A, and can include a second three pairs of metal and dielectric layers. Structure 210 can include one or more sub-structures, also referred to as vertical channel structures 212. Vertical channel structure 212 can include, for example, a transistor 212A, or any other semiconductor component, and can be formed in the sub-stack 205A. Another vertical channel structure 212, such as a transistor 212B, can be formed in the sub-stack 205B above the vertical channel structure 212A. Transistors 212A and 212B, which can be used as an example of vertical channel structures 212, can include a PMOS semiconductor transistor, while transistor 212B can be a NMOS semiconductor transistor, or vice versa. The structure 210 can also include a core 255 that can include a central portion of the structure 210 and that can be etched out and then filled in with electrically insulating dielectric material providing electrical insulation between the one or more transistors 212A and 212B and between a transistor 212A and the silicon substrate 120.

Transistor 212A can include a gate structure 240A, a first source/drain (S/D) structure 220A, and a second S/D structure 225A. Either of the S/D structures 220A or 225A can correspond to a source or a drain contact of the transistor 212A. The first S/D structure 220A can include, adjoin, or abut a first S/D silicide 230A. The second S/D structure 235A can include, adjoin, or abut a second S/D silicide 235A. Similarly, transistor 212B can include a gate structure 240B, a first source/drain (S/D) structure 220B and a second S/D structure 225B. Either S/D structure 220B or 225B can correspond to a source or a drain of the transistor 212B. The first S/D structure 220B can include, adjoin or abut a first S/D silicide 230B. The second S/D structure 235B can include, adjoin or abut a second S/D silicide 235B. The first and second silicides 230/235 in the transistors 212A and 212B can include fully or partially salicided thin films of silicide metals. The first and second silicides 230/235 in the transistors 212A and 212B can lower the ohmic contact between the metal layer contacts (e.g. 105) and the transistors 212A and 212B, thereby more efficiently providing power to the source and drain contacts (e.g. first and second S/D structures 220/225) of the transistors 212A and 212B.

The solution illustrated in the example in FIG. 16 can provide for multiple metal types of 3D routing for 360 degree access to various substructures in the structure 210, such as for example, sources, gates, and drains of transistors 212 in the structure 210. The present solution can provide different 3D salicidation for different source and drain regions (e.g., S/D structures 220/225) in the same 3D layer stack 201. 3D salicidation can be controlled with precision as 360 degree ALD deposition can be used for depositing silicide metals. The present solution provides multiple process flows for fabricating the structures described herein. For example, a process flow can provide an entire layer stack 201 with 3D devices formed in the structure 210 to be salicided in one process step using one, two, or more metal types. Enhanced 3D conductivity can be achieved with transistor performance boost due to at least reduced ohmic contact due to source and drain contacts 220/225 salicided with respective S/D silicides 230/235.

Shown, for example, in FIGS. 1-15, is an embodiment of a fabrication flow for manufacturing a structure 210 with one or more epitaxially grown vertical transistor structures, which in the illustrated example include transistors 212A and 212B. Each transistor 212A and 212B includes improved conductivity for S/D structures 220/225 in which silicides 230/235 form reduced ohmic contact, and thereby lower electrical losses for source and drain structures 220/225.

Referring now to FIG. 1, a cross-sectional view 100 and a top view 102 are illustrated in which a material layer stack 201 having several layers of materials is provided or formed. As shown in the illustrated example, a layer stack 201 of materials can be formed on a substrate, such as a silicon 120 substrate. Layer stack 201 can include multiple sub-stacks, such as sub-stack 205A and 205B. The layer stack 201 can include layers of dielectric 1 (identified in the illustration as 110) alternating with layers of metal 1 (identified in the illustration as 105). The layer stack 201 can include a layer of dielectric 110 on a silicon substrate 120 on top of which at least six pairs of metal 105 and dielectric 110 layers that can be formed in alternating fashion. The substrate may be formed of other materials, as previously described.

More specifically, on top of a silicon 120 substrate, a first layer of dielectric 110 can be formed. A first layer of metal 105 can be formed or deposited on top of the first layer of dielectric 110. Thereafter, a second layer of dielectric 110 can be formed on top of which a second layer of metal 105 can be formed, which can be followed by a third layer of dielectric 110, which can be followed by a third layer of metal 105. The first three pairs of alternating layers of dielectric 110 and metal 105 can form a first sub-stack 205A.

A fourth layer of dielectric 110 can be formed on top of the third layer of metal 105. The fourth layer of dielectric 110 can have a depth or a thickness that is larger than depths or thicknesses of the prior three layers of dielectric 110 or metal 105. The fourth layer of dielectric 110 can separate the sub-stacks 205A and 205B, as shown in cross-sectional view 100 taken along the double-sided arrow shown in the top view 102.

Still referring to FIG. 1, on top of the fourth layer of dielectric 110, a fourth layer of metal 105 can be formed, on top of which a fifth layer of dielectric 110 can be formed, on top of which a fifth layer of metal 105 can be formed, which can be followed by a sixth layer of dielectric 110, which can be followed by a sixth layer of metal 105, which can be followed by a seventh layer of dielectric 110. The thickness or depth of each of fourth through sixth layers of dielectric 110 and metal 105 can be same or similar as those of each of the first through third layers of dielectric 110 and metal 105 and can be smaller than the depth or thickness of the fourth layer of dielectric 110. On top of the seventh layer of dielectric 110, can be a layer of dielectric 2 (identified in the illustration as 115), which can include a thickness or depth that is greater than each of the third through sixth layer of dielectric 110 or metal 105. The layer of dielectric 115 can be larger than the layer of the fourth layer of dielectric 110. The portion of material stack 201 that includes metal 105 layers three through six, along with their corresponding dielectric 110 layers can form sub-stack 205B, which can be separated from sub-stack 205A by fourth layer of dielectric 110. On top of dielectric 115, can be a layer of PR (i.e., the photoresist, identified as 125). The layer of PR 125 can include a thickness or depth that is larger than the depth or thickness of any one of layers of dielectric 110 or metal 105.

As shown in top view 102, an etch mask defining openings can be formed on the layer stack 201. An anisotropic, directional downward etch can be executed through the layer stack 201 until reaching or uncovering an underlying layer of semiconductor material (e.g., silicon 120). In doing so, an opening 250, which can also be referred to as a hole or a cavity 250, can be formed in the layer stack 201. The opening 250 can extend from the top surface of the PR 125 layer, through all layers of 105, 110 and 115 and end at or near the top surface of silicon 120.

Figure 2:
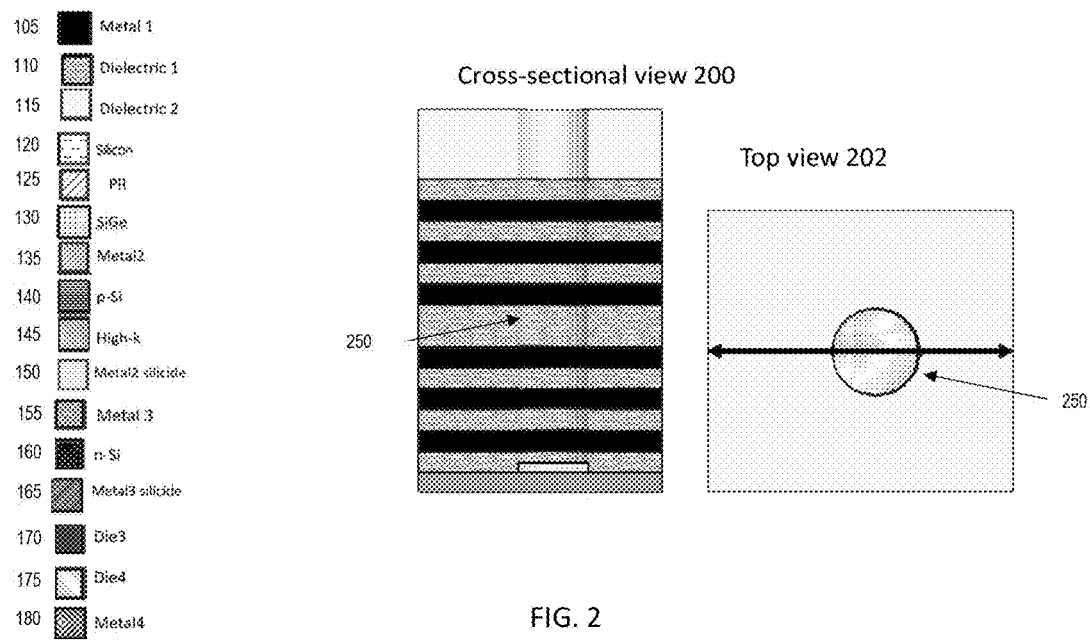

Referring now to FIG. 2, a cross-sectional view 200 and a top view 202 are illustrated in which the cross-sectional view 200 represents a cross-section taken along the double-sided arrow shown traversing the top view 202. Once the opening 250 has been created in the layer stack 201 and the underlying substrate material (e.g., silicon 120) is uncovered, epitaxial growth within opening/cavity 250 can begin. A layer of a semiconductor material can be epitaxially grown at the bottom of the opening 250, such that this layer does not reach or cross the first metal 105 layer. This layer of grown material can include SiGe material (identified in illustration as 130), which can be a sacrificial layer that can be used to electrically isolate from the structure 210 to be formed within opening 250 from the underlying substrate (e.g., silicon 120).

Figure 3:
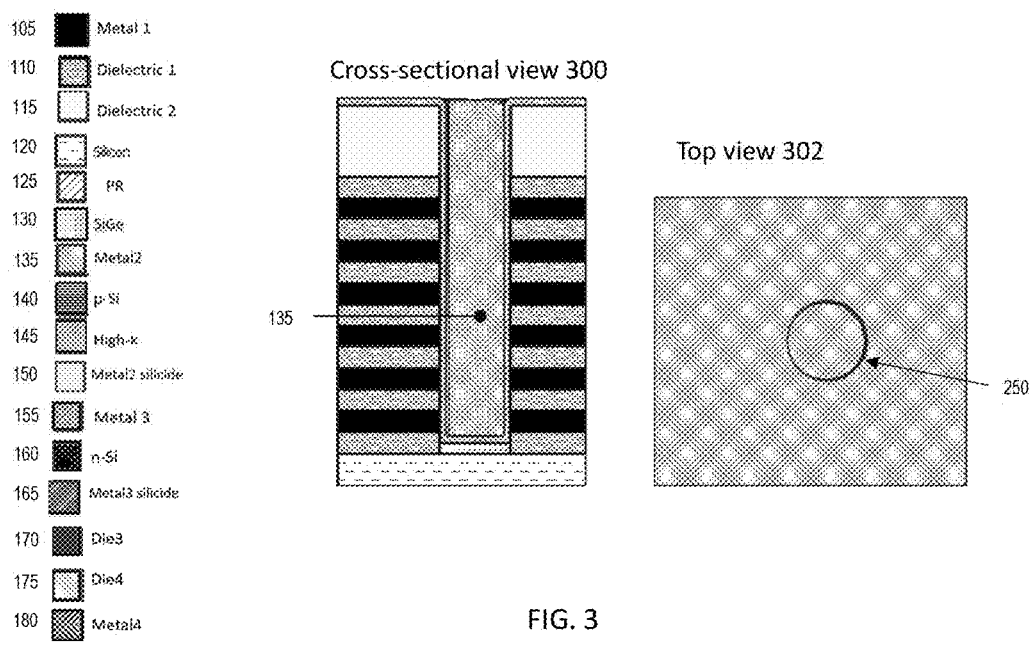

In FIG. 3, a cross-sectional view 300 and a top view 302 are illustrated in which a conformal deposition of metal 2 (identified as 135) can be executed so that a layer of metal 135 coats the interior walls of the opening 250 and the top surface of the SiGe 130 sacrificial layer. Metal 135 can include a silicide metal, a metal suitable for forming silicide when annealed together with an adjoining semiconductor material. Following implementation of this step, a chemical mechanical polishing (CMP) can be performed to remove the surplus metal 135 from the top surface of the layer stack 201.

Figure 4:
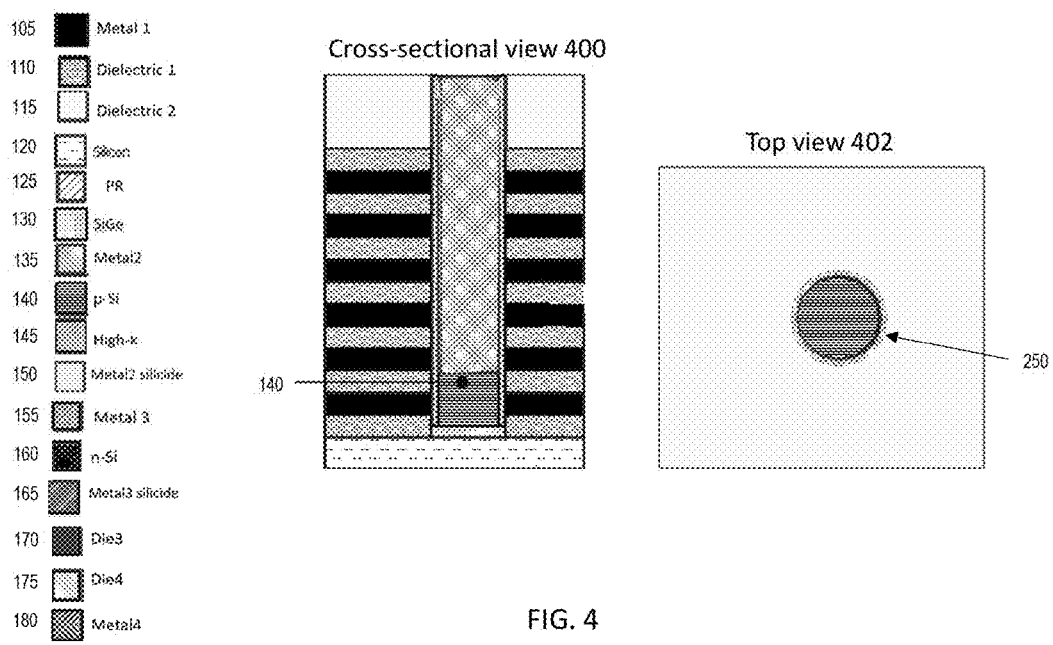

In FIG. 4, a cross-sectional view 400 and a top view 402 are illustrated in which a directional etch can be executed through the opening 250 to remove the conformal deposition of metal 135 from horizontal surfaces. This removal can include exposing the top surface of the SiGe 130 sacrificial layer to subsequent deposition. Epitaxial growth of the transistor 212 structure can then be continued. In this example, a p-doped silicon (e.g., p-Si, identified as 140) can be grown on top of SiGe 130 to the height that can be in plane with, or exceed the height of, the first metal 105 layer. For example, p-Si 140 can be formed so that its height is at a level that interfaces with, or extends past, at least the top portion of the first dielectric 110 layer and the first metal 105 layer and clear at least a bottom portion of the second dielectric 110 layer.

Figure 5:
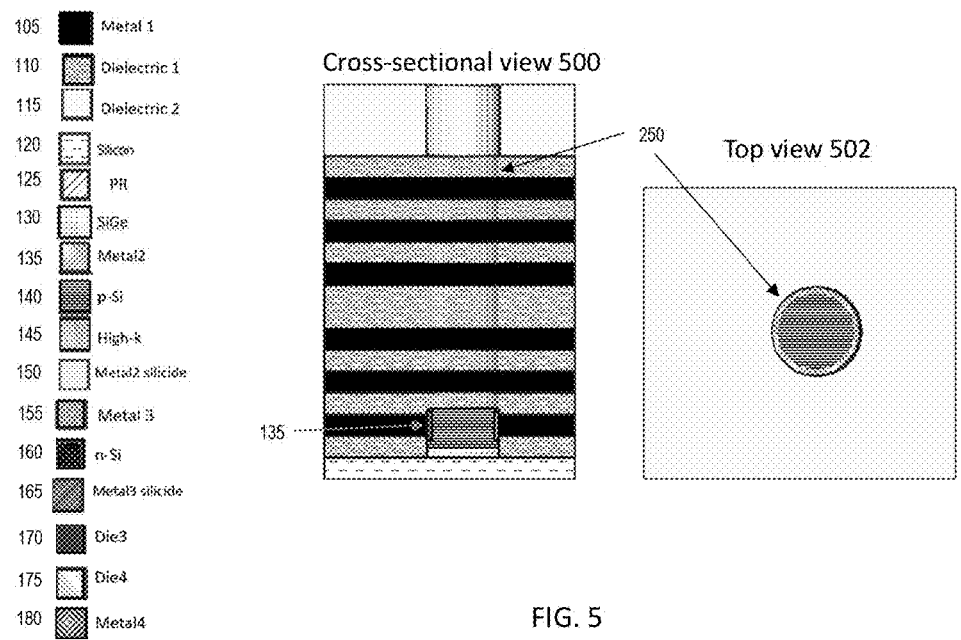

In FIG. 5, a cross-sectional view 500 and a top view 502 are illustrated in which an isotropic etch of metal 135 can be executed to remove uncovered portions of metal 135 from all exposed surfaces, including the sidewalls in the opening 250. The remaining portion of the metal 135 that is covered by the p-Si 140 can form an interface between the first metal 105 layer and the p-Si 140 material and can remain intact within opening 250 and be protected from the isotropic etch. This interface can form a first S/D structure 220A along with its S/D silicide 230A.

Figure 6:
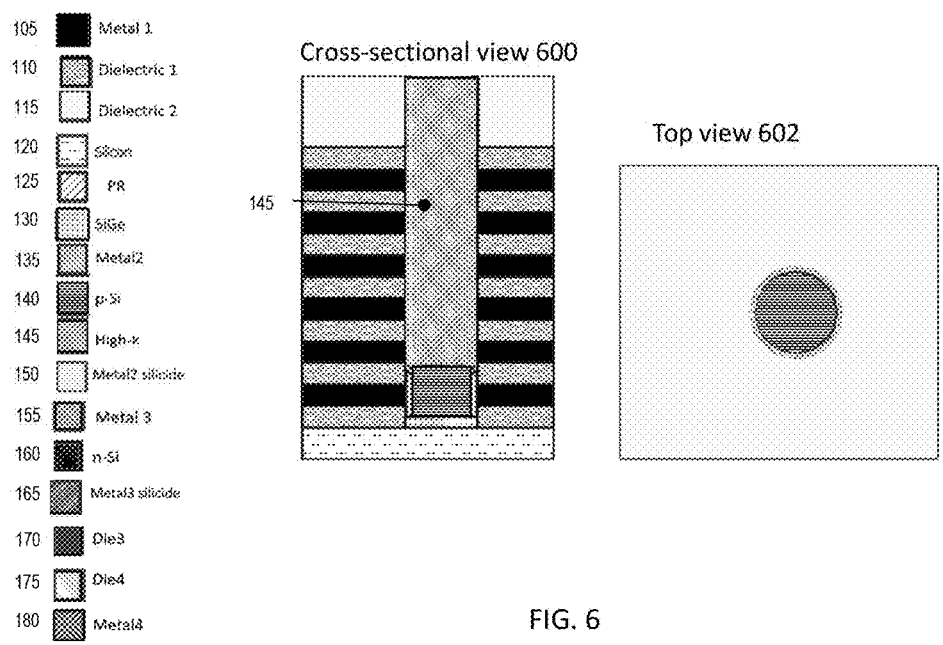

In FIG. 6, a cross-sectional view 600 and a top view 602 are illustrated in which a high-k (identified as 145) material can be conformally deposited (e.g., by atomic layer deposition) to coat all the exposed surfaces in the opening 250. Once high-k 145 is deposited so as to coat the interior walls of the opening 250, an anisotropic etch can be performed to remove the high-k 145 material from the horizontal surfaces (e.g., top surface of the p-Si 140) thereby leaving high-k 145 layer deposited on the sidewalls of the opening 145, but not on the top exposed surface of the p-Si 140.

Figure 7:
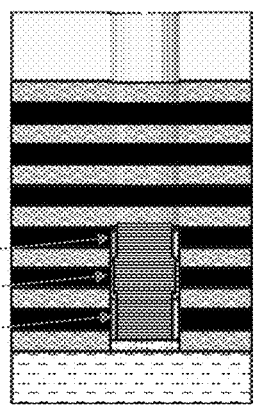
Figure 7:
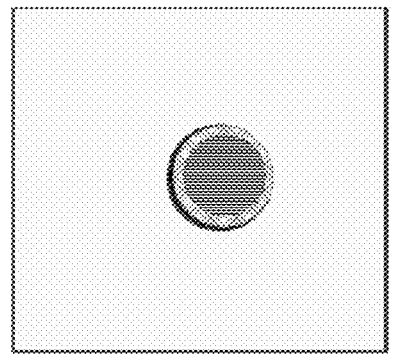

In FIG. 7, a cross-sectional view 700 and a top view 702 are illustrated in which epitaxial growth of p-Si 140 can be continued. First, epitaxial growth of p-Si 140 can continue along the second metal 105 layer so as to form an interface of high-k 145 between the second metal 105 layer and p-Si 140. The p-Si 140 can be grown to the height of above the second metal 105 layer, so as to cover a lower portion of the third layer of dielectric 110. This step can be followed by an isotropic etching of the high-k dielectric, so as to remove high-k 145 from all exposed surfaces, including interior wall surfaces of the opening 250. As a result, high-k 145 can remain protected between the p-Si 140 and the second metal 105 layer. This can form a gate structure 240A of the transistor 212A.

Still referring to FIG. 7, the process of forming a metal 135 interface between a metal 105 layer and p-Si 140 that is described in connection with FIGS. 3-5 can be repeated to form metal 135 interfacial layer between the third layer of metal 105 and the p-Si 140 to be grown at the height of the third metal 105 layer. As a result, P—Si 140 can be formed so that its height is at a level that interfaces with, or extends past, at least the top portion of the third dielectric 110 layer, the entire third metal 105 layer and at least a bottom portion of the fourth dielectric 110 layer. This can form a second S/D structure 225A along with its S/D silicide 235A.

Figure 8:
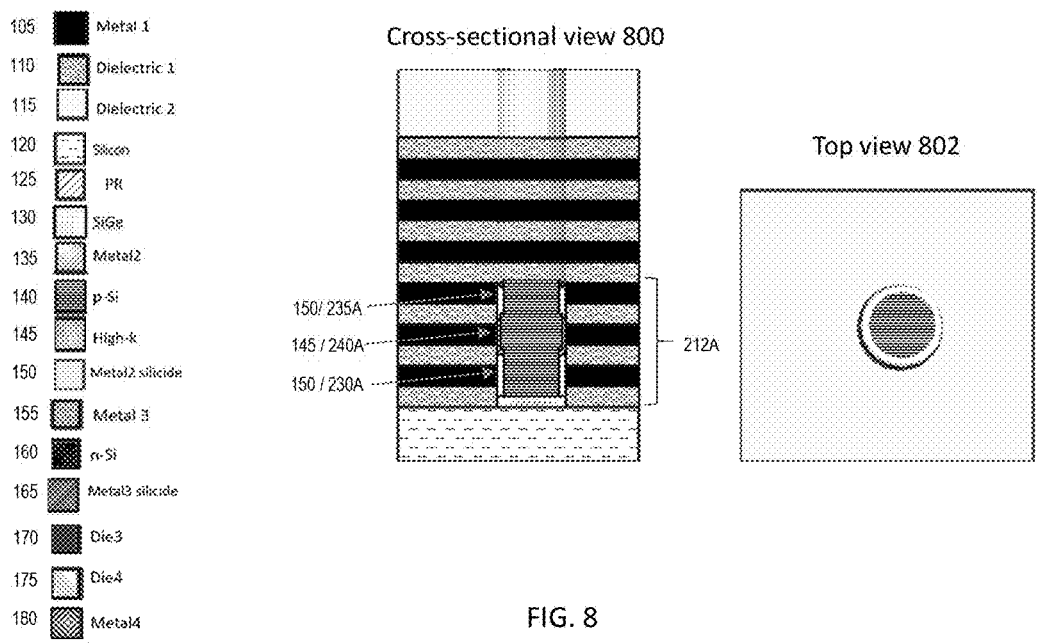

In FIG. 8, a cross-sectional view 800 and a top view 802 are illustrated in which metal 135, deposited in connection with FIG. 3 and FIG. 7, can be formed or turned into silicide using an annealing process. For example, annealing can be performed using a bake module or a targeted laser annealing procedure. The annealing can be focused on sub-stack 205a (see FIG. 16) or any particular part of the sub-stack 205a, such as a first or second S/D silicide 230 (see FIG. 16). In an example, the annealing process can include exposing of the layer stack 201 for a set period of time to a particular temperature or temperature range. For example, annealing can be performed by exposing the features to be annealed to a temperature of anywhere between 150 C and 800 C, for a time duration of 1 to 500 seconds, depending on the type of materials used. For example, a silicide layer can be formed using titanium metal as metal 135 with a monocrystalline silicon substrate by rapid thermal annealing at about 700-800 C for between 1 to 240 seconds. Similarly, depending on the material properties, metal 135 can be annealed at temperatures that are at least 150 C, 200 C, 250 C, 300 C, 350 C, 400 C, 450 C, 500 C, 550 C, 600 C, 650 C, 700 C, 750 C or 800 C, for a time period that is at least 1 s, 2 s, 3 s, 5 s, 10 s, 15 s, 20 s, 30 s, 45 s, 60 s, 100 s, 150 s, 200 s, 250 s, 300 s, 350 s, 400 s, 450 s or 500 s. Once annealing is performed, metal 135 can include at least a portion of its material that turns into metal 2 silicide (identified as 150). Metal silicide 150 can replace the entire metal 135 thin film that is applied at an interface between metal 105 and p-Si 140. In some implementations, a portion of metal 135 turns into metal silicide 150, a silicide formed in place of the thin film metal (e.g., metal2 135) suitable for forming silicide at the intersection with the semiconductor (e.g., p-Si 140). Metal silicide 150, (e.g., silicide formed by heating the thin film of metal 135) can replace or extend into a portion of p-Si 140 at, or around, the interface at the third layer of metal 105. This interface can form first and second S/D silicides 230A and 235A (see FIG. 16), for the S/D structures 220A and 225A.

Figure 9:
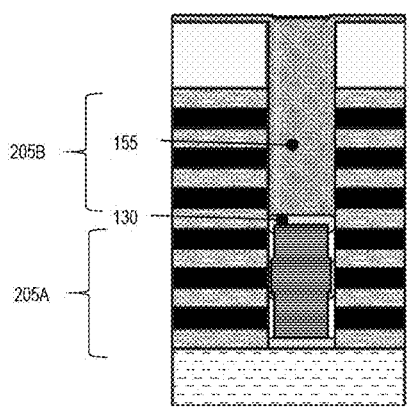
Figure 9:
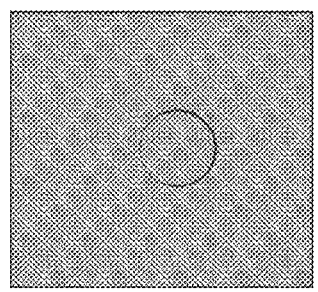

In FIG. 9, a cross-sectional view 900 and a top view 902 are illustrated in which a layer of sacrificial SiGe 130 can be grown on top of p-Si 130 to define a region that will electrically isolate the sub-stack 205A from the sub-stack 205B to be formed above sub-stack 205A. To start forming the transistor 212B in sub-stack 205B, metal 3 (identified as 155) can be deposited conformally within the opening 250 to coat all the exposed surfaces with metal 155. This step can be performed in a similar fashion to the step described in connection with FIG. 3. Metal 155 can be a silicide metal used for salicidation of first S/D structure 220B of transistor 212B.

Figure 10:
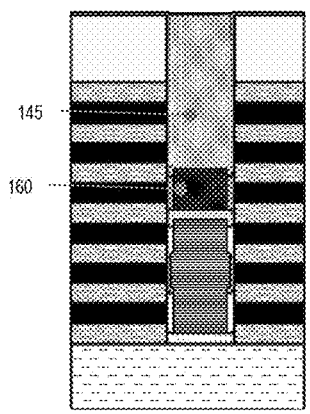
Figure 10:
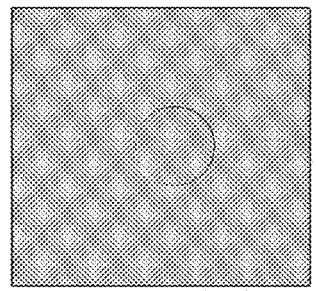

In FIG. 10, a cross-sectional view 1000 and a top view 1002 are illustrated in which an n-doped silicon (e.g., n-Si, which in the illustration is identified as 160) can be epitaxially grown within the opening 250 to be in plane, or at the height of, the fourth metal 105 layer. More specifically, n-Si 160 can be formed so that its height is at a level that interfaces with, or extends past, at least the top portion of the fourth dielectric 110 layer, the entire fourth metal 105 layer and at least a bottom portion of the fifth dielectric 110 layer. Using an isotropic etch, uncovered portions of metal 155 can be removed, leaving only the metal 155 portions that are enclosed or protected by the n-Si 160. This can complete the S/D structure 220B of transistor 212B along with its silicide metal 155.

Still referring to FIG. 10, the isotropic etch can be followed by conformal deposition of high-k 145, which can be implemented using steps and techniques similar to those described in connection with FIG. 6. Directional etch can be performed to remove high-k 145 from the horizontal surfaces, thereby leaving the high-k 145 at the sidewalls of the opening 250 for the gate interface. This directional etch can be followed by continued epitaxial growth of n-Si 160 to complete forming gate structure 240B of transistor 212B.

Figure 11:
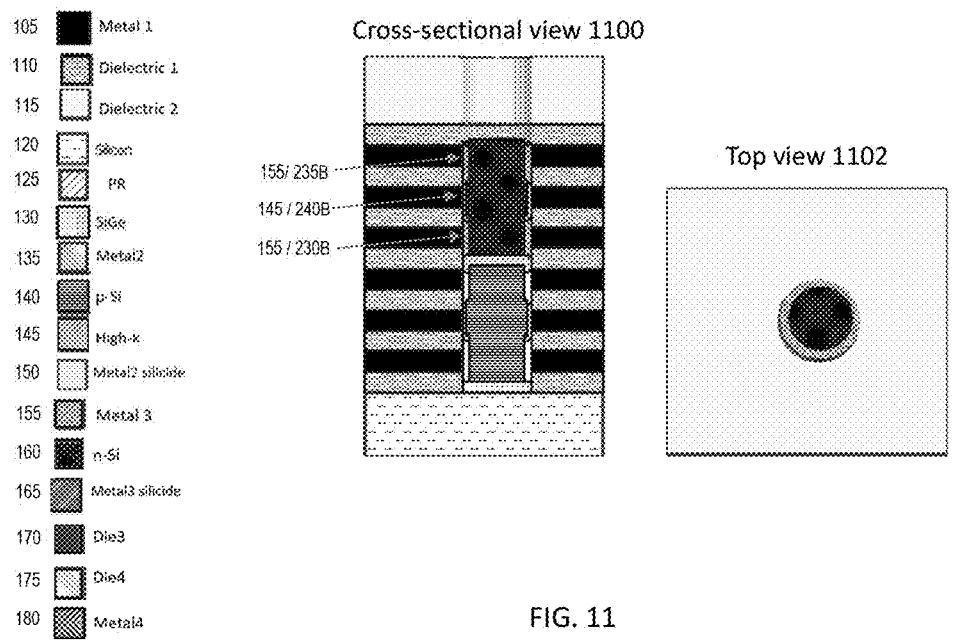

In FIG. 11, a cross-sectional view 1100 and a top view 1102 are illustrated in which the metal 155 deposition on the sidewalls can be applied, followed by growth of n-Si 160 and etching using the steps similar to those described in connection with FIG. 7. This growth and etching can result in the sixth metal 105 layer having a metal 155 interface with epitaxial core material (n-Si 160), similar to the metal 135 interfacing with third metal 105 layer in FIG. 7, and can complete the S/D structure 225B of transistor 212B along with its silicide metal 155.

Figure 12:
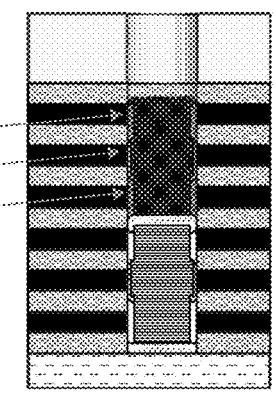
Figure 12:
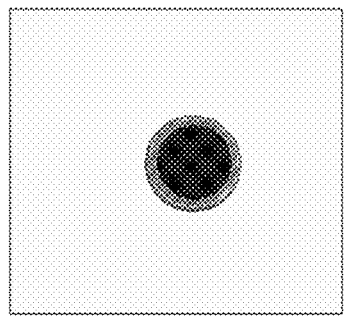

In FIG. 12, a cross-sectional view 1200 and a top view 1202 are illustrated in which metal 155 can be annealed using the same or similar techniques described in connection with FIG. 8. The annealing process can be targeted or focused on the sub-stack 205B or a particular portion of sub-stack 205B to which the annealing is directed, such as to complete the first and second S/D silicide 230B/235B. Upon annealing, metal 155 layers disposed between the fourth layer of metal 105 and n-Si 160 and the sixth layer of metal 105 and n-Si 160 can be turned into metal 3 silicide (identified in the illustration as metal silicide 165). Metal silicide 165 can include the prior layers of metal 155, as well as a portion of the surrounding n-Si 160.

Figure 13:
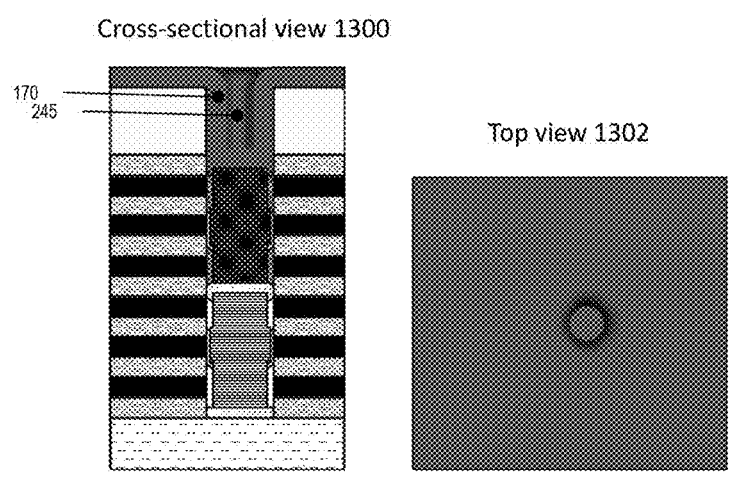

In FIG. 13, a cross-sectional view 1300 and a top view 1302 are illustrated in which a conformal deposition of Die 3, also referred to as dielectric 3 and identified in the illustration as 170, can be executed. Dielectric 170 can be conformally deposited such that its thickness is less than half of the diameter of the opening 250. The thickness of dielectric 170 can be larger than the thicknesses of either high-k 145 or metals 135 and 155 in connection with FIGS. 3-11. Dielectric 170 deposition can form a hole 245 for a self-aligned downward directional etching of epitaxially grown material inside of the opening 250.

Figure 14:
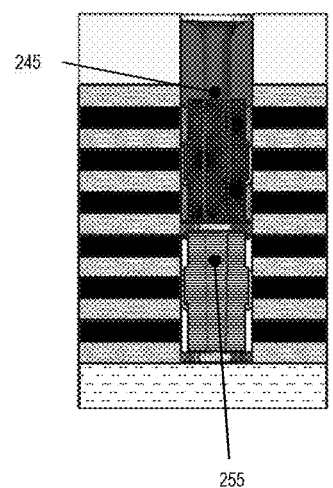
Figure 14:
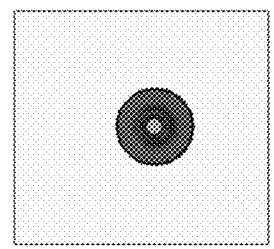

In FIG. 14, a cross-sectional view 1400 and a top view 1402 are illustrated in which a self-aligning directional etch of dielectric 170 can be executed through the hole 245 to leave materials deposited on the sidewalls within the opening 250 and remove only the cross-sectional diameter of the epitaxially grown materials along the cross-section of the hole 245. Upon the completion of the downward etch through the self-aligning hole 245, a central region core 255 of the structure 210 can be etched out using the hole 245 formed by dielectric 170 as the etch mask of the downward directional etch. The resulting etching provides a hollow core of the vertical channel structure 210. Sacrificial epitaxial materials (e.g., SiGe 130) can be etched isotropically to be fully removed from the structure 210, thereby creating isolated vertical channel transistors 212 from each other and from the underlying substrate (e.g. silicon 120).

Figure 15:
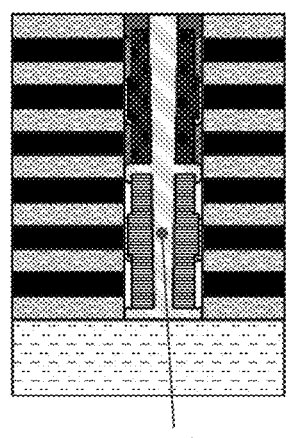
Figure 15:
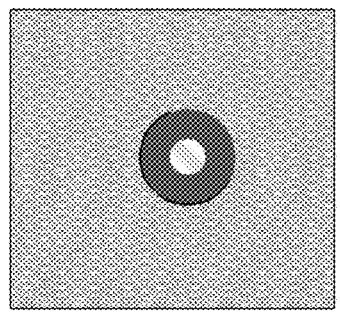

In FIG. 15, a cross-sectional view 1500 and a top view 1502 are illustrated in which the hollow core region 255 can be filled with dielectric 4 or die 4 (in the illustration identified as 175). Dielectric 175 can be the same or different material as any of the dielectrics 110, 115 and 170. For example, each of dielectrics 110, 115, 170 and 175 can include different material or different material composition ratios such that a given dielectric material (e.g., any one of 110, 115, 170 or 175) can be selectively etched without etching other remaining materials in the structure 210.

Figure 17:
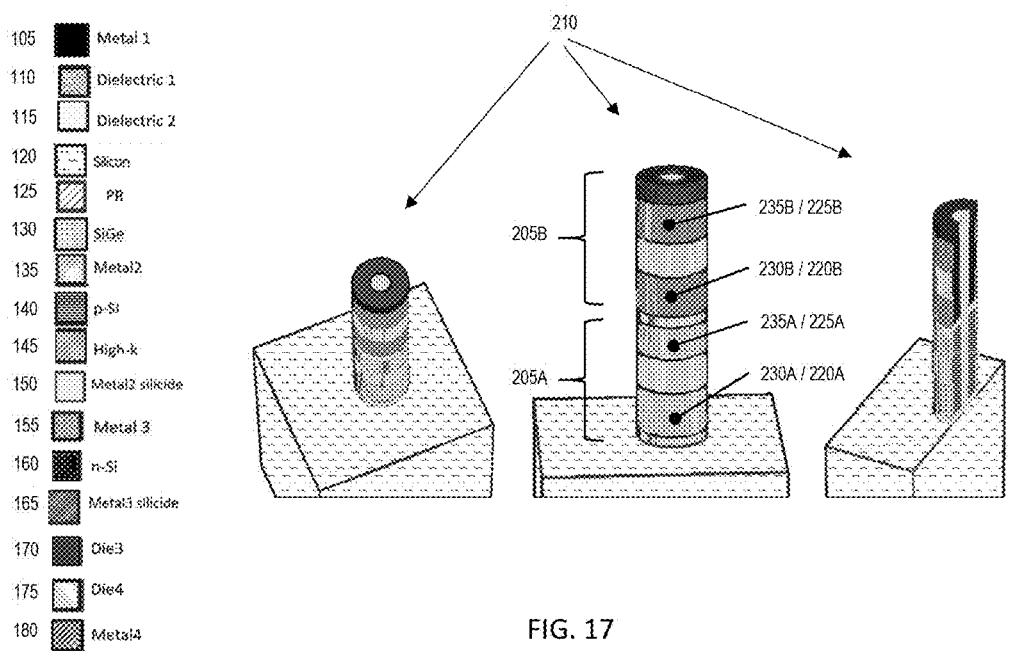

FIGS. 16-17 show perspective three-dimensional and cross-sectional views of example structures 210 that include transistors 212A and 212B from varying angles. FIG. 16 shows a perspective cross sectional view of a layer stack 201 that includes sub-stacks 205A and 205B. Inside of opening 250, the vertical channel structure 210 is formed, including the transistor 212A formed in sub-stack 205A and transistor 212B formed in sub-stack 205B. Transistor 212A includes first S/D structure 220A that can comprise or abut first S/D silicide 230A and a second S/D structure 225A that can comprise or abut second S/D silicide 235A. Transistor 212B includes first S/D structure 220B that can comprise or abut first S/D silicide 230B and a second S/D structure 225B that can comprise or abut second S/D silicide 235B. Using techniques described in connection with FIGS. 1-15, silicide layers are provided for improving electrical contact by lowering electrical ohmic contacts with the source and drain structures 220 and 225, which can further enhance the electrical properties of both the p-type and n-type transistors.

FIG. 17 illustrates three-dimensional perspective views of the structures 210 shown with the surrounding layer stack 201 removed. As illustrated in FIG. 17, structures 210 can be shaped as cylindrical columns, formed above a substrate 120 and can include multiple transistors 212A and 212B (or other electrical structures or circuits). Although the illustrated embodiment shows only two transistors 212A and 212B, an NMOS and a PMOS, any number of electrical structures, transistors or otherwise can be included in a single structure 210.

FIGS. 18-22 illustrate an alternative method in which a same silicide metal material can be used for both NMOS and PMOS transistors 212. FIGS. 18-22 illustrate an example in which a vertical structure 210 provides improved electrical conductivity and routing by using one type of metal for all layout routing and one silicide metal to form S/D silicides 230/235 to salicide source and drain structures (e.g. first and second S/D structures 220 and 225) for all transistors 212 in the entire structure 210. This example flow can provide simultaneous salicidation of multiple source and drain structures 230 in a structure 210.

Figure 18:
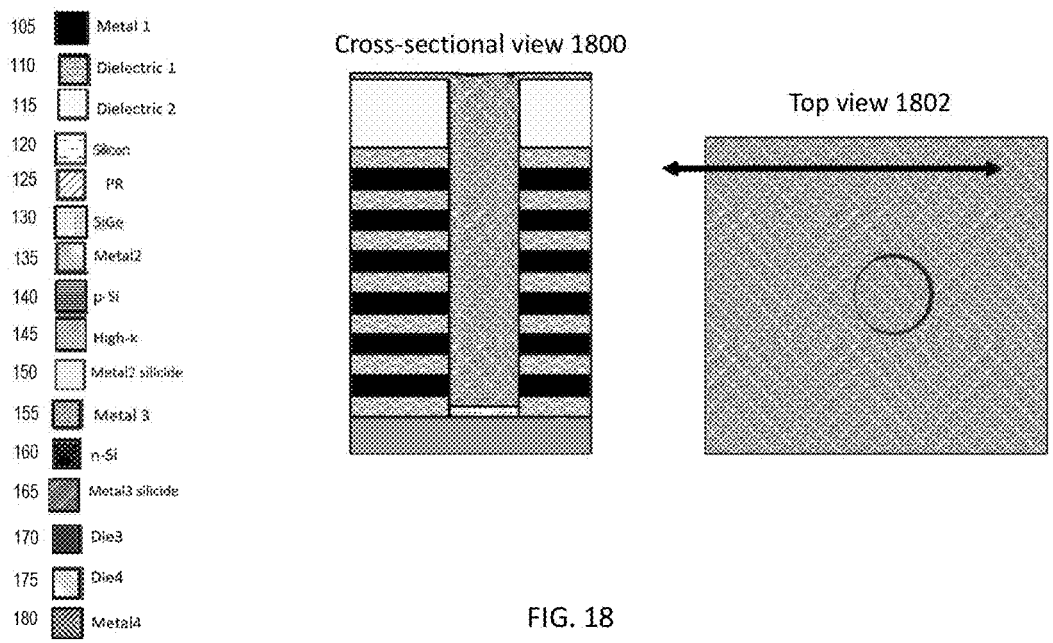
FIGS. 18-22 include cross-sectional and top-down of an embodiment of an example fabrication flow for manufacturing a structure in which one type of metal can be used for electrical line layout and one silicide metal can be used for internal 3D salicidation regions.

In FIG. 18, a cross-sectional view 1800 and a top view 1802 are illustrated in which an epitaxial growth of SiGe 130 layer inside at the base of the opening 250 can be performed on top of the Si 120 substrate. Once this is completed, metal 155 can be deposited to coat all of the exposed surfaces in the opening 250. The steps performed here can be the same or similar to those described in connection with FIG. 3.

Figure 19:
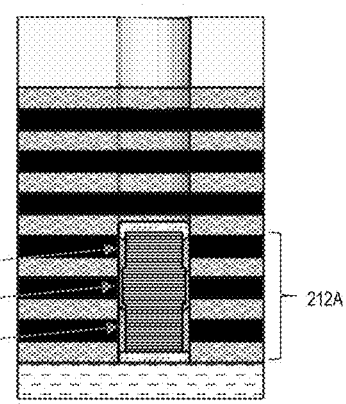
Figure 19:
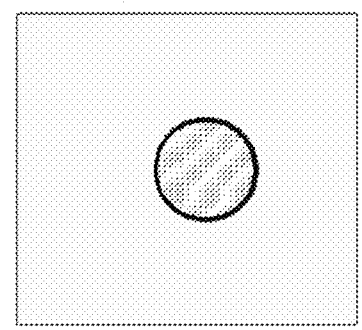

In FIG. 19, a cross-sectional view 1900 and a top view 1902 are illustrated in which fabrication steps that are same or similar to those described in connection with FIGS. 4-9 can be performed, but this time using a single type of silicidation metal (e.g., metal 155) for the entire structure 210. For example, a transistor 212A of structure 210 can be formed starting from the steps in FIG. 18 to perform a directional etching of metal 155, followed by epitaxial growth of p-Si 140 past the height of the first metal 105 layer. This can be followed by an ALD deposition of high-k 145 and a directional etch of the high-k 145 to remove it from the top surface of the p-Si 140. Then, epitaxial growth of p-Si 145 can be continued along the height of the gate structure 240A, which can be followed by isotropic etching of high-k 145 to remove high-k 145 from the sidewalls of the opening 250. Isotropic deposition of metal 155 can then be implemented, followed by directional etching of the metal 155. Further, epitaxial growth of p-Si can be implemented to complete the second S/D structure 225, which can be followed by isotropic etching of metal 155, followed by the final epitaxial growth of SiGe 130 to provide isolation between the transistor 212A and the transistor 212B to be formed above transistor 212A.

Figure 20:
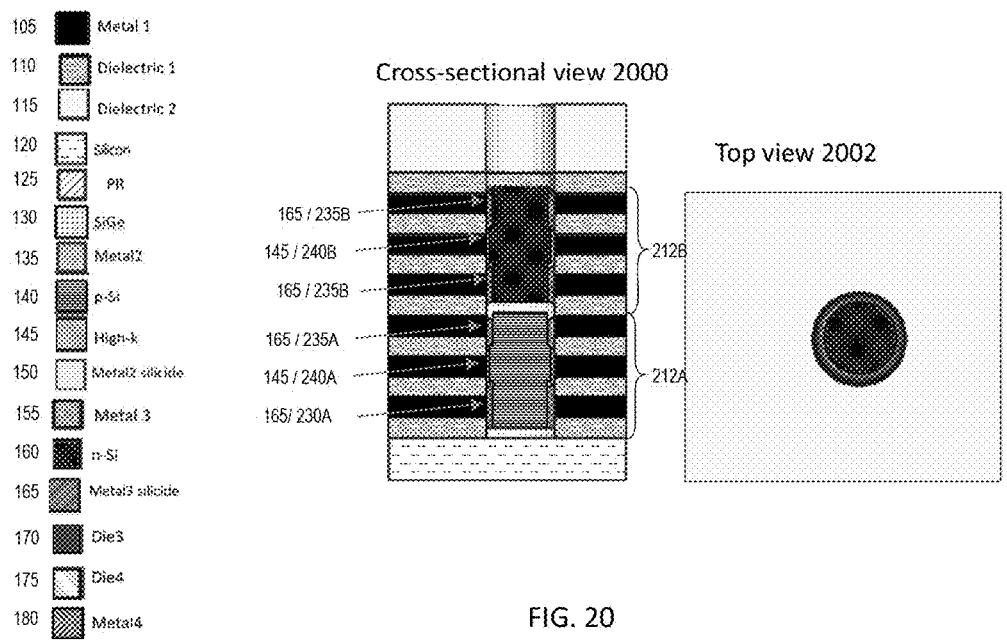

In FIG. 20, a cross-sectional view 2000 and a top view 2002 are illustrated in which the structure 210 can continue to be formed using same or similar steps as those implemented in connection with FIGS. 10-11. For example, following the steps completed in connection with FIG. 19, a transistor 212B can be formed by epitaxially growing n-Si 160 material using the steps described in connection with FIGS. 10-11. Upon completion of these steps, in some implementations, transistor 212A can be annealed to turn metal 155 into metal silicide 165 for S/D silicides 230A and 235A of transistor 212A. In some implementations, transistor 212B can include metal 155 in S/D structures 220B/225B that may not yet be annealed.

Metal 155 can be annealed in either transistor 212 one by one, such that silicides 230A/235A in 212A are annealed at a different time than silicides 230B/235B in transistor 212B. Alternatively, silicides 230 and 235 in both transistors 212A and 212B can be annealed at the same time or in a single fabrication step, thus creating or finalizing first and second silicides 230A and 235A in transistor 212A and first and second silicides 230B and 235B in transistor 212B. Upon annealing, metal 155 can turn into metal silicide 165. Annealing can be performed using the same or similar steps as those described in connection with FIG. 8 and FIG. 12.

Figure 21:
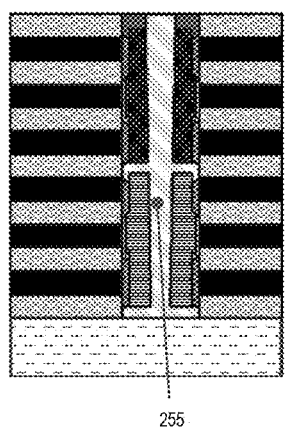
Figure 21:
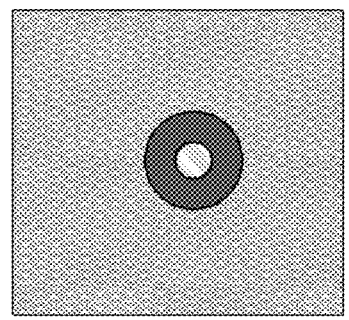

In FIG. 21, a cross-sectional view 2100 and a top view 2102 are illustrated in which the same or similar steps as those described in connection with FIGS. 13-15 are performed. As a result, core 255 can be completed through the center of the structure 210.

Figure 22:
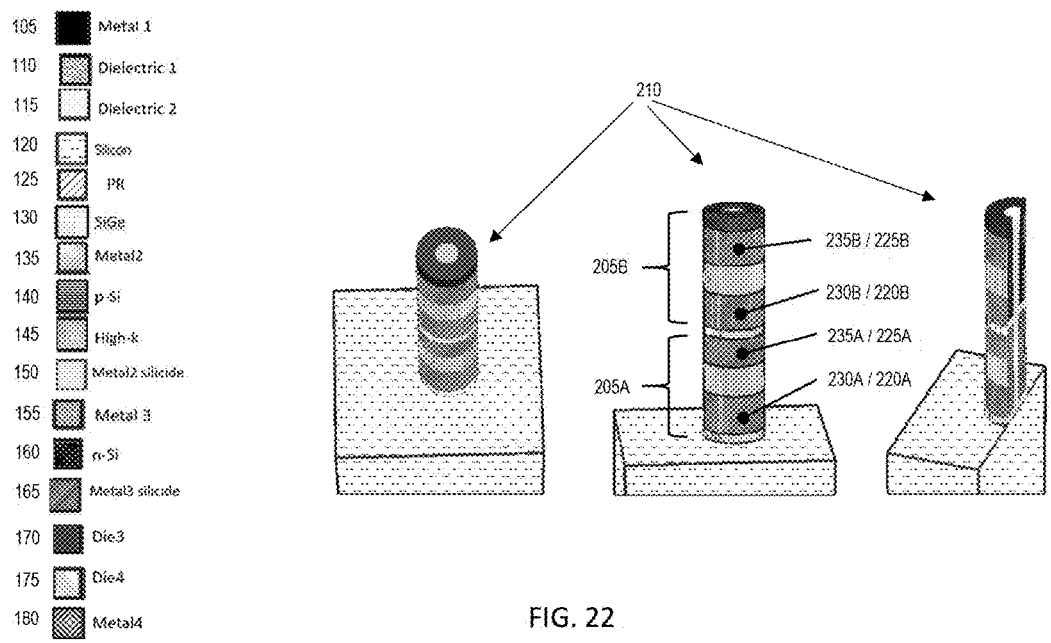

FIG. 22 shows illustrates three-dimensional perspective views of the structures 210 shown with the surrounding layer stack 201 removed. As illustrated in FIG. 22, structures 210 can be shaped as cylindrical columns, disposed on substrate 201 and can include multiple transistors 212 (or other electrical structures or circuits), which in each S/D structure 220/225 includes a S/D silicide 230/235 created using the same metal 155 to turn into metal silicide 165.

Figure 23:
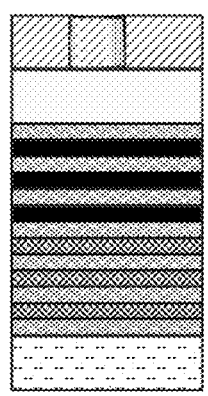
FIGS. 23-24 include cross-sectional and top-down of an embodiment of a fabrication flow for manufacturing a structure in which two types of metal can be used for electrical line layout and two types of silicide metals can be used for internal 3D salicidation regions.
Figure 23:
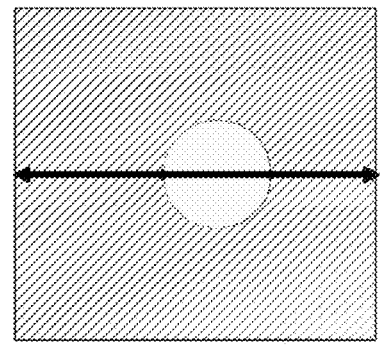
Figure 24:
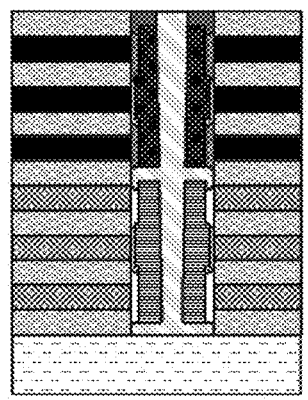
Figure 24:
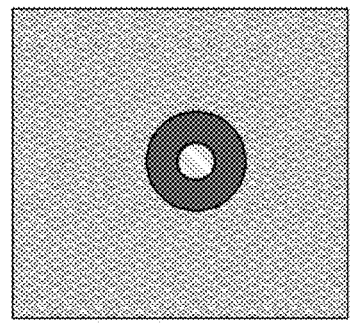

FIG. 23-24 illustrate an alternative method in which two types of metal layers can be used for layout and two silicide metals can be used for salicidation. More specifically, the same flow that is described in connection with FIGS. 1-17 and FIGS. 18-22 can be performed again, but this time with a different type of metal layer in the sub-stack 205B. In the illustrated example, a layer stack 201 can include three layers with metal 180 material used as metal layers in sub-stack 205A for the PMOS device transistor 212A and three layers of metal 105 used as metal layers in sub-stack 205B for the NMOS device transistor 212B. In one example, different silicide materials (e.g., different silicide metals) can be used for each type of device in each sub-stack 205A and 205B.

In FIG. 23, a cross-sectional view 2300 and a top view 2302 are illustrated in which a layer stack 201 can be formed having the same or similar features or descriptions as the one described in connection with FIG. 1, except that in FIG. 23 the first three metal layers include metal 180 instead of metal 105. Meanwhile, the fourth through sixth metal layers can include metal 105, the same as in FIG. 1.

In FIG. 24, a cross-sectional view 2400 and a top view 2402 are illustrated in which fabrication steps that are same or similar to those described in connection with FIG. 15 can be performed, with primary difference being anisotropic etching of metal 180 (which includes as all layer) as explained in step 2.

Figure 25:
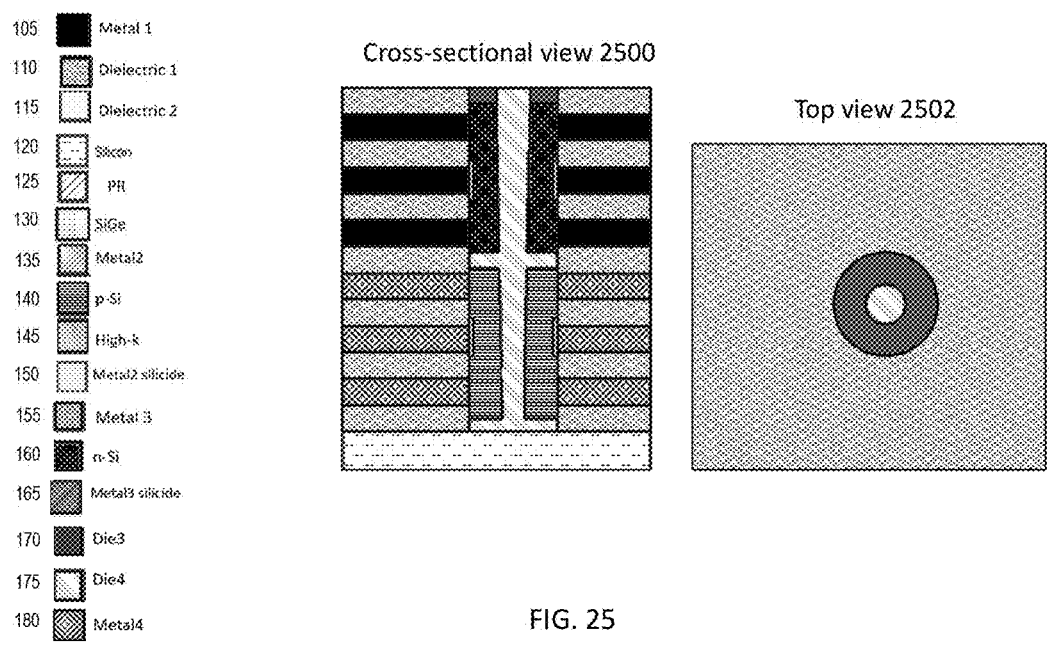
FIGS. 25-26 include cross-sectional and top-down of an embodiment of a fabrication flow for manufacturing a structure in which two external routing metals for electrical line layout and two types of silicide metals can be used for external 3D salicidation regions.
Figure 26:
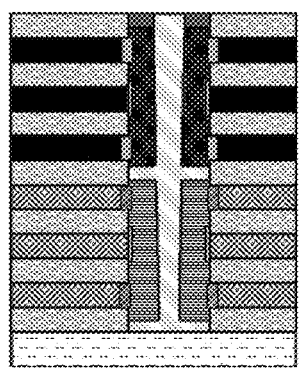
Figure 26:
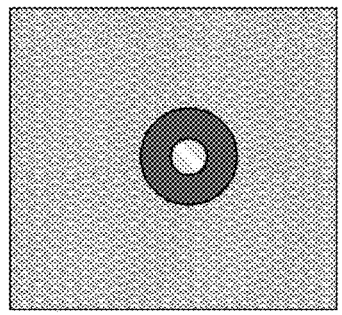

FIGS. 25-26, illustrate an alternative method in which two types of external routing metal materials can be used for layout and two silicide metal materials can be used for external salicidation regions. In some aspects, this fabrication flow allows for an entire stack of 3D devices to be salicided in one process step with two or more metal types. Any number of devices in the stack can be formed and salicidation of those devices can be performed using a single annealing step.

In FIG. 25, a cross-sectional view 2500 and a top view 2502 are illustrated in which a fabrication process that is same or similar to the fabrication process described in connection with FIGS. 23-24 and can be performed up to the point when rapid thermal annealing (RTA) is implemented to form the silicide for source and drain structures 220/225 of both transistor 212A and 212B.

In FIG. 26, a cross-sectional view 2600 and a top view 2602 are illustrated in which steps similar to those described in connection with FIGS. 23-24 are performed. However, in some implementations, silicide for source and drain structures 220/225 for both transistors 212A and 212B can be formed using the RTA step. For example, an RTA step can be performed to form silicide 230/235 for two different metal S/D structures 220/225 in different transistors 212. In some implementations, two separate RTA steps for the different metal regions can be performed, such that, for example, silicide involving metal 135 can be performed at one temperature threshold, while silicide involving metal 155 can be performed at another silicide threshold.

Referring now to FIGS. 1-26, the present solution can relate to a semiconductor structure, which can be a part of a semiconductor circuit, a processor or a system. The semiconductor structure can be a layer stack 210, which can include multiple layers of one or more metals (e.g., 105, 180) and multiple layers of one or more dielectrics (e.g., 110, 115, 170, 175). Each of the layers of the metal (e.g., 105, 180) can be separated from another layer of metal (e.g., 105, 108) by a layer of a dielectric (e.g., 110, 115, 170, 175). The semiconductor structure can include an opening (e.g., 250) formed in the layer stack (e.g., 201) such that a semiconductor layer (e.g., 120) beneath the plurality of layers of the metal is uncovered. The semiconductor structure can include a vertical channel structure (e.g., 212) that can be formed within the opening (e.g., 250) by epitaxial growth. The epitaxial growth can include epitaxial growth of n-type or p-type semiconductor material, such as n-type doped silicon (e.g., 160), or a p-type doped silicon (e.g., 140). The vertical channel structure (e.g., 212) can include an interface of a silicide metal (e.g., 135, 155) with a first metal layer (e.g., 105, 180) of the plurality of metal layers. The interface can correspond to one of a source (e.g., 220, 225) or a drain (e.g., 220, 225) connection of a transistor (e.g., 212A). The structure can include the silicide interface between the vertical channel structure (e.g., 212) and the first metal layer (e.g., 105, 180) formed by annealing the silicide metal (e.g., 135, 155) above a temperature threshold.

The semiconductor structure can include the layer stack (e.g., 201) that includes three layers of the metal (e.g., 105, 180) and two layers of the dielectric (e.g., 110, 115, 170, 175), wherein each of the two layers of the dielectric is distinct from one another and separates the three layers of the metal. The semiconductor structure can include a layer of material (e.g., 175) between the vertical channel structure (e.g., 212) and the semiconductor layer (e.g., 120), electrically insulating the vertical channel structure from the semiconductor layer. The semiconductor structure can include the vertical channel structure (e.g., 212) including a layer, or a portion, of electrically conductive material on top of the vertical channel structure, the layer of electrically conductive material in electrical contact with one of the source or the drain of the vertical channel structure 212.

The semiconductor structure can define a hole (e.g., 250) filled by a second dielectric (e.g., 170) over a central portion of the vertical channel structure (e.g., 212) and a channel defined by the hole (e.g., 245) that is downward etched into the central portion of the vertical channel structure (e.g., 212) and filled with one of the dielectric (e.g., 105), the second dielectric (e.g., 170), or a third dielectric (e.g., 115, 175). The semiconductor structure can include a core region of the vertical channel structure (e.g., 212) that is removed to form a core channel (e.g., 255), where a core dielectric may be disposed in the core channel.

The semiconductor structure can include a second vertical channel structure (e.g., transistor 212B) formed by epitaxial growth within the opening (e.g., 250) and within a sub-stack (e.g., 205B) of the layer stack (e.g., 201), the sub-stack (e.g., 205B) including three metal layers of a second metal (e.g., 105, 180) that alternate with layers of a second dielectric (e.g., 110, 115, 170, 175). The semiconductor structure can include a second silicide interface (e.g., 230B, 235B) between the second vertical channel structure (e.g., 212B) and a first layer of the second metal (e.g., 105, 180). The second silicide interface can be formed by annealing above a temperature threshold a second silicide metal (e.g., 135, 155) disposed between the first layer of the second metal (e.g., 105, 180) and the second vertical channel structure (e.g., 212). The semiconductor structure can include the second silicide interface (e.g., 230B, 235B) that corresponds to one of the source or the drain connection of second vertical channel structure (e.g., 212B). The semiconductor structure can include a material within the opening (e.g., 250) electrically insulating the vertical channel structure (e.g., 212A) from the second vertical channel structure (e.g., 212B). The semiconductor structure can include a core region (e.g., 255) extending through a center of a vertical channel structure (e.g., 212A) and a center of the second vertical channel structure (e.g., 212B), the core region (e.g., 255) filled with a dielectric that provides electrical insulation to at least one of the vertical channel structure or the second vertical channel structure.

Figure 27:
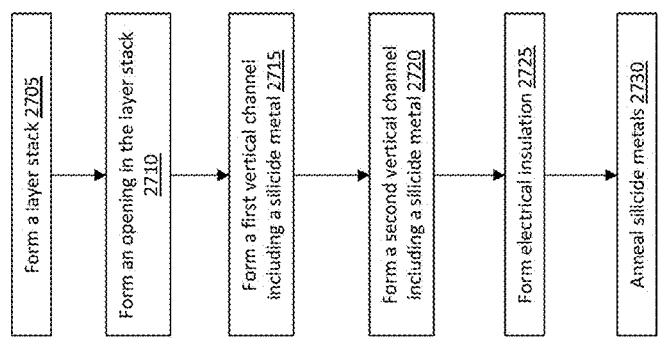
FIG. 27 is a flow diagram of an example method for fabricating the structures with salicidation regions in connection with FIGS. 1-26, according to one or more embodiments.

Referring now to FIG. 27, illustrated is a flow diagram of an example method 2700 for fabricating one or more vertical channel structures (e.g., 210) in a material stack (i.e. 201). The method 2700 can include any one or more acts or fabrication step illustrated or described in connection with any one or more of FIGS. 1-26. The method 2700 can be for manufacturing one or more structures (e.g., 210), each having one or more vertical channel structures (e.g., transistors 212A and 212B), each one of which can include source and drain structures or contacts (e.g., 220, 225) that can have silicides (230, 235) for reducing ohmic contact of the source and drain contacts and improving performance.

The method 2700 of FIG. 27 can include a series of steps 2705 to 2730 for fabricating material layers (e.g., 201) and their structures (e.g., 210) along with their internal components described in FIGS. 1-26. Step 2705 can include forming a layer stack. Step 2710 can include forming an opening in the layer stack. Step 2715 can include forming a first vertical channel including a silicide metal. Step 2720 can include forming a second vertical channel including a silicide metal. Step 2725 can include forming an electrical insulation. Step 2730 can include annealing silicide metals.

Step 2705 can include forming a layer stack. The formed layer stack can include multiple layers of a metal. Each of the plurality of layers of the metal can be separated by a layer of a dielectric. The layer stack can be formed to include at least three layers of the metal material and two layers of the dielectric material. The layer stack can be formed so that each of the two layers of the dielectric is distinct from one another and separates the three layers of the metal.

The layer stack can be formed to include multiple sub-stacks. For example, the layer stack can include a first sub-stack that can include three metal layers of a first metal that alternate with layers of a first dielectric. The layer stack can also include a second sub-stack that can include three metal layers of the first (e.g., same) or a second (e.g., different) metal that alternate with layers of the first (e.g., the same) or a second (e.g., different) dielectric. The layer stack can be formed to include forming the first metal of the first sub-stack and the second metal of the second sub-stack using a same metal. The layer stack can be formed to include forming the first metal of the first sub-stack and the second metal of the second sub-stack using a different metal. The layer stack can be formed so that metal layers can correspond to electrical contacts for the source, gate and drains of vertical transistor structures to be formed in the layer stack. The layer stack can be formed using an electrically conductive doped semiconductor layer instead of the metal layer. Layer stack can be formed in accordance with the description of any one of the FIGS. 1, 18, 23 and 25.

Step 2710 can include forming an opening in the layer stack. Forming an opening in the layer stack can include directional downward etching of the layer stack so that a semiconductor layer beneath the plurality of layers of the metal is uncovered. Directional downward etching can create an opening that is cylindrical and extends multiple layers of metal and dielectric into the layer stack. Forming the opening can include directional downward etch of the layer stack to a depth that is less than (e.g., above) the substrate level. Forming the opening in the first layer stack can include etching downward through the first and second sub-stacks. The opening can be at the depth of the one of the sub-stacks. The opening can be at the depth of both sub-stacks or all sub-stacks, such that a semiconductor layer beneath the first and second sub-stacks, as well as all other sub-stacks, is uncovered. Opening can be formed using any techniques described herein, including those described in connection with FIG. 1.

Step 2715 can include forming a first vertical channel including a silicide metal. The first vertical channel can include a transistor structure. Forming a vertical channel structure within the opening can be implemented by epitaxial growth. The vertical channel structure can include a vertically oriented transistor whose source, gate and drain are each vertically aligned with each other. The vertically oriented transistor can include a first one of a source or a drain formed above a gate which can be formed above the remaining one of the source or the drain.

Forming the first vertical channel can include forming an interface of a silicide metal next to, adjoining or with a first metal layer of the plurality of metal layers of the layer stack. The interface of the silicide metal can include silicide metal layer. The interface with silicide metal can be aligned with or corresponding to one of a source or a drain connection of a transistor, such as a vertical transistor structure formed in the opening. The interface can be formed within the first vertical channel structure using a first silicide metal at a first metal layer for one of a source or a drain connection. The interface for the remaining one of the source or the drain connection can be similarly formed within the vertical channel structure using the first or the second silicide metals. Forming a first vertical channel along with its silicide source and drain contacts can include, for example, any steps or techniques described in connection with FIGS. 3-8.

Forming the vertical channel within the opening can include forming a hole through a central cross-sectional portion (e.g., a core region) of the vertical channel that can be filled with dielectric. The hole can be formed using a dielectric material, such as a dielectric material different from the dielectric material used for the layer stack. The dielectric material can form a hole over the central portion (e.g., core region) of the vertical channel structure. The formed by a dielectric over the central portion of the vertical channel can be used to directionally etch the central portion of the vertical channel structure and form a core channel. The etched out central portion (e.g., core channel) can be filled with dielectric material, such as one of the dielectric used in the layer stack, the second dielectric used to make the hole or another third dielectric material. A core dielectric material can be disposed in the core. The etched out central portion can also be left empty (e.g., filled with air alone).

Step 2720 can include forming a second vertical channel including a silicide metal. Forming a second vertical channel can include any steps used for forming a first vertical channel in step 2715. The second vertical channel can be formed within the opening on top of, or above, the first vertical channel. The second vertical channel can be formed within the opening underneath, or below, the first vertical channel. The second vertical channel can be vertically aligned with the first vertical channel. The source, gate and drain of the second vertical channel can be vertically aligned with the source, gate and drain of the first vertical channel. Forming a second vertical channel along with its silicide source and drain contacts can include, for example, any steps or techniques described in connection with FIGS. 9-12.

Forming the second vertical channel structure can include forming an interface of a second silicide metal at second metal layer for a source or a drain connection of the second silicide metal. Forming the second vertical channel structure can include forming an interface of a first silicide metal at a second metal layer for the source or the drain connection of the second silicide metal. Forming the interfaces of the first and second silicide metals can include forming the interfaces using different silicide metals. Forming the interfaces of the first and second silicide metals can include forming the interfaces using the same silicide metals.

Step 2725 can include forming an electrical insulation. Forming one or more vertical channel structures, such as a transistors within the opening in the layer stack, can be done such that a first vertical channel structure of the first sub-stack is separated from a second vertical channel structure of the second sub-stack. For example, a first vertical channel structure can include epitaxially grown doped semiconductor material, which can be electrically insulated from an epitaxially grown doped semiconductor material of a second vertical channel structure by an intervening dielectric. A layer of material or a structure comprising electrically insulating dielectric can be formed between the vertical channel structure and the semiconductor layer to electrically insulate the vertical channel structure from the semiconductor layer. A layer of material or a structure can be formed within the opening to electrically insulate the first vertical channel structure from the second vertical channel structure.

The electrically insulating structure can include a core structure comprising a dielectric. The core structure can cylindrically extend through the central portion of the vertical channel structure and expand or widen to the outer edges of the portion of the opening intervening between the vertical channel structure and the substrate layer to electrically insulate the vertical channel structure from the substrate layer beneath. The core structure can cylindrically extend through the central portion of the vertical channel structure and expand or widen to the outer edges of the portion of the opening between a first vertical channel structure and a second vertical channel structure to electrically insulate the first vertical channel structure from the second vertical channel structure.

Forming electrical insulation can include forming SiGe layers, such as shown or described in connection with FIGS. 2 and 9. Forming electrical insulation can include etching out a core structure along with etching out SiGe layers, such as shown or described in connection with FIGS. 13-14. Forming electrical insulation can include filling the etched out core with a dielectric, such as shown and described in connection with FIG. 15.

Step 2730 can include annealing silicide metals. Annealing can be implemented by applying heat to silicide metals using an oven or a heating device. Annealing can be implemented by using a laser to anneal the silicide metal. Annealing a silicide metal can include heating the silicide metal above a temperature threshold. Heating the silicide metal can cause forming of a silicide interface between the vertical channel structure and the first metal layer. Annealing the silicide metal can form a silicide interface between the semiconductor material of the vertical channel structure and the metal layer abutting, adjoining or interfacing with the semiconductor material.

In structures that include multiple vertical channel structures, annealing can include annealing of the first silicide metal for a first vertical channel structure and annealing of the second silicide metal for the second vertical channel structure. Annealing can form a first silicide interface between the first vertical channel structure and the first metal layer for one of the source or the drain connection, and form a second silicide interface between the second vertical channel structure and the second metal layer for the remaining one of the source or drain connection. Annealing the first silicide metal and the second silicide metal can be performed at a same time. Annealing of the structure 210 or its components (e.g. transistors 212A and 212B) can be implemented using any techniques described, for example, in connection with FIGS. 8, 12, 20, and 21.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method of microfabrication, the method comprising:
   forming a layer stack, the layer stack including a plurality of layers of a metal, each of the plurality of layers of the metal separated by a layer of a dielectric;
   forming an opening in the layer stack such that a semiconductor layer beneath the plurality of layers of the metal is uncovered;
   forming a vertical channel structure within the opening by epitaxial growth, the vertical channel structure having an interface of a silicide metal with a first metal layer of the plurality of metal layers, the interface corresponding to one of a source or a drain connection of a transistor; and
   annealing the silicide metal above a temperature threshold to form a silicide interface between the vertical channel structure and the first metal layer.

2. The method of claim 1, wherein forming the layer stack includes forming three layers of the metal and two layers of the dielectric, wherein each of the two layers of the dielectric is distinct from one another and separates the three layers of the metal.

3. The method of claim 1, further comprising forming a layer of material between the vertical channel structure and the semiconductor layer to electrically insulate the vertical channel structure from the semiconductor layer.

4. The method of claim 1, wherein forming the vertical channel structure includes forming a hole using a second dielectric material on top of the vertical channel structure to directionally etch a central portion of the vertical channel structure through the hole and fill the central portion with one of the dielectric, the second dielectric or a third dielectric material.

5. The method of claim 1, further comprising:
   removing a core region of the vertical channel structure to form a core channel; and
   disposing a core dielectric in the core channel.

6. A method of microfabrication, the method comprising:
   forming a first layer stack, a first layer of the first layer stack having at least two sub-stacks, a first sub-stack including three metal layers of a first metal that alternate with layers of a first dielectric, a second sub-stack including three metal layers of a second metal that alternate with layers of the first dielectric,
   forming an opening in the first layer stack through the first and second sub-stacks such that a semiconductor layer beneath the first and second sub-stacks is uncovered;
   forming vertical channel structures within the opening by epitaxial growth such that a first vertical channel structure of the first sub-stack is separated from a second vertical channel structure of the second sub-stack;
   forming, within the first vertical channel structure, an interface of a first silicide metal at a first metal layer for one of a source or a drain connection, and
   forming, within the second vertical channel structure, an interface of a second silicide metal at second metal layer for a remaining one of the source or the drain connection,
   the first silicide metal and the second silicide metal forming a first silicide interface between the first vertical channel structure and the first metal layer for one of the source or the drain connection, and a second silicide interface between the second vertical channel structure and the second metal layer for the remaining one of the source or drain connection.

7. The method of claim 6, wherein forming the interfaces of the first and second silicide metals includes forming the interfaces using different silicide metals.

8. The method of claim 6, wherein forming the vertical channel structures within the opening includes forming a layer of material to electrically insulate the first vertical channel structure from the second vertical channel structure.

9. The method of claim 6, wherein annealing the first silicide metal and the second silicide metal are performed at a same time.

10. The method of claim 6, wherein forming the first layer stack includes forming the first metal of the first sub-stack and the second metal of the second sub-stack using a same metal.

\* \* \* \* \*